United States Patent
Takase (10) Patent No.: US 7,808,854 B2
(45) Date of Patent: *Oct. 5, 2010

(54) SYSTEMS AND METHODS FOR DATA TRANSFERS BETWEEN MEMORY CELLS

(75) Inventor: Satoru Takase, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

This patent is subject to a terminal disclaimer.

(21) Appl. No.: 12/033,198

(22) Filed: Feb. 19, 2008

(65) Prior Publication Data

US 2009/0207679 A1    Aug. 20, 2009

(51) Int. Cl.
*G11C 7/00*    (2006.01)

(52) U.S. Cl. .................. 365/205; 365/189.011; 365/190

(58) Field of Classification Search .................. 365/205
See application file for complete search history.

(56) References Cited

U.S. PATENT DOCUMENTS

| | | | |
|---|---|---|---|
| 5,305,280 A * | 4/1994 | Hayano | 365/230.03 |
| 5,708,622 A * | 1/1998 | Ohtani et al. | 365/189.17 |
| 5,844,845 A | 12/1998 | Tahara | |
| 5,892,724 A * | 4/1999 | Hasegawa et al. | 365/230.03 |
| 6,157,584 A | 12/2000 | Holst | |
| 6,169,684 B1 * | 1/2001 | Takahashi et al. | 365/49.12 |
| 7,366,044 B2 * | 4/2008 | Takase | 365/205 |
| 2001/0010654 A1 * | 8/2001 | Shau | 365/222 |

FOREIGN PATENT DOCUMENTS

| | | |
|---|---|---|
| JP | H09-73774 | 3/1997 |
| JP | 2000-156078 | 6/2000 |

OTHER PUBLICATIONS

Dosaka et al., A 100 MHz 4Mb Cache DRAM with Fast Copy-back Scheme, IEEE Journal of Solid State Circuits vol. 27, No. 11, Nov. 1992 (pp. 1534-1539).

* cited by examiner

*Primary Examiner*—Son L Mai
(74) *Attorney, Agent, or Firm*—Law Offices of Mark L. Berrier (57) ABSTRACT

Systems and methods for reducing the latency of data transfers between memory cells by enabling data to be transferred directly between sense amplifiers in the memory system. In one embodiment, a memory system uses a conventional DRAM memory structure having a pair of first-level sense amplifiers, a second-level sense amplifier and control logic for the sense amplifiers. Each of the sense amplifiers is configured to be selectively coupled to a data line. In a direct data transfer mode, the control logic generates control signals that cause the sense amplifiers to transfer data from a first one of the first-level sense amplifiers (a source sense amplifier) to the second-level sense amplifier, and from there to a second one of the first-level sense amplifiers (a destination sense amplifier.) The structure of these sense amplifiers is conventional, and the operation of the system is enabled by modified control logic.

20 Claims, 8 Drawing Sheets

SYSTEMS AND METHODS FOR DATA TRANSFERS BETWEEN MEMORY CELLS

CROSS-REFERENCE TO RELATED APPLICATIONS

This application claims the benefit of U.S. patent application Ser. No. 11/425,438, filed Jun. 21, 2006, which is hereby incorporated by reference as if set forth in its entirety.

BACKGROUND

1. Field of the Invention

The invention relates generally to memory systems, and more particularly to systems and methods for reducing the time required to transfer data from one memory cell to another by avoiding the routing of the data through a processor or other memory controller.

2. Related Art

As the desire for faster and more powerful computing systems drives the development of new technologies, older technology is rapidly become less useful and even obsolete. Recent processors operate at faster clock speeds than ever before, and memory systems are capable of providing huge amounts of storage for data. As these processors access these large memories, however, the latency of the data in the memories is increasingly becoming a problem.

While the speed at which the memory systems operate has not decreased, in many instances it has not kept pace with increases in processor speed. This situation has been aggravated by the fact that, with faster processors and more available memory, more data transfers are typically performed by current systems than in earlier systems. For instance, current applications commonly make many data transfers from one memory location to another.

While it may appear that data transfers from one memory location to another should not take any appreciable amount of time, this is not the case. Conventionally, these data transfers involve reading data from one memory location into a processor register, and then writing the data from the register back into a different memory location. When viewed more closely, the process of simply getting the data from the memory location to the processor register alone conventionally involves, the data being read from a memory cell by first sense amplifier, the output of the first sense amplifier being read by a second sense amplifier, the output of the second sense amplifier being written into an I/O buffer, the data being read from the I/O buffer into a cache memory (or, typically, several successive levels of cache memories,) and then the data being read into the processor register. The process of getting the data from the register to the second memory location involves the reverse of this process. Thus, the origin of data latency in a simple memory-to-memory data transfer becomes more evident.

Because the latency of these types of memory-to-memory data transfers is becoming larger in comparison to other processing tasks, it would be desirable to provide a means to reduce latency in these types of transfers.

SUMMARY OF THE INVENTION

One or more of the problems outlined above may be solved by the various embodiments of the invention. Broadly speaking, the invention includes systems and methods for reducing the latency of data transfers between memory cells by enabling data to be transferred directly between sense amplifiers in the memory system. In one embodiment, a memory system uses a conventional DRAM memory structure, but rather than transferring data from a memory cell through this structure to a processor register, and then back through the memory structure to a second memory cell, the data path is short-circuited through the sense amplifiers that are coupled to the memory cells. By avoiding the routing of the data path through the additional memory structure components (e.g., I/O buffers, memory controllers, cache memories, processor registers,) the additional latency associated with the portion of the data path passing through these components is eliminated.

One embodiment comprises a memory system having a pair of first-level sense amplifiers, a second-level sense amplifier and control logic for the sense amplifiers. Each of the sense amplifiers is configured to be selectively coupled to a data line. The system is configured to operate in a direct data transfer mode in which the control logic controls the sense amplifiers to transfer data from a first one of the first-level sense amplifiers (a source sense amplifier) to the second-level sense amplifier, and then to a second one of the first-level sense amplifiers (a destination sense amplifier.)

In one embodiment, the control logic isolates the second-level sense amplifier from higher-level memory components so that only the three sense amplifiers are involved in the data transfer. In this embodiment, the source sense amplifier is connected to the data line to put its data on the data line. The second-level sense amplifier is then to the data line while the source sense amplifier is coupled to the data line so that the second sense amplifier has the data from the source sense amplifier. The source sense amplifier is then disconnected from the data line and the destination sense amplifier is connected to the data line to receive the data from the second sense amplifier. The system may simultaneously transfer bits from multiple memory cells (e.g., DRAM cells) in this manner. Some of the bits may be masked so that the values in the destination memory cells are not affected by the operation. The system may be conventional in structure (except for the control logic) and may also operate in a conventional read mode in which data is read from a memory cell and passed to higher-level memory system components rather than being transferred directly to another memory cell.

Another embodiment may comprise a method in which first- and second-level sense amplifiers (which may be conventional in structure) are controlled to transfer data from a source first-level sense amplifier to a second-level sense amplifier, and then to a destination first-level sense amplifier, without involving higher-level memory system components. In one embodiment, the three sense amplifiers are successively coupled to a data line to effect the transfer from one sense amplifier to the next. The method may include select either this direct data transfer mode or a conventional read mode in which data is read from a memory cell (via the corresponding first-level sense amplifier) and is passed by the second-level sense amplifier to higher-level memory system components such as an I/O buffer.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for reducing the latency of data transfers between memory cells by enabling data to be transferred directly between sense amplifiers in the memory system. In one embodiment, a memory system uses a conventional DRAM memory structure, but rather than transferring data from a memory cell through this structure to a processor register, and then back through the memory structure to a second memory cell, the data path is short-circuited through the sense amplifiers that are coupled to the memory cells. By avoiding the routing of the data path through the additional memory structure components (e.g., I/O buffers, memory controllers, cache memories, processor registers,) the additional latency associated with the portion of the data path passing through these components is eliminated.

In one embodiment, a memory system uses a plurality of DRAM cells in a conventional memory structure to store data bits. Each DRAM cell in this system is coupled to a corresponding sense amplifier (the "first" sense amplifier.) The first sense amplifier is then coupled to a second sense amplifier, which in turn is coupled to an I/O buffer. The I/O buffer is coupled to a memory controller, and the memory controller is coupled to the first in a series of caches. For example, the memory system may include an L1 cache, and L2 cache and an L3 cache. The memory controller is coupled to the L3 cache, which is coupled to the L2 cache, which is coupled to the L1 cache. The L1 cache is then coupled to a register in the processor.

Conventionally, data is transferred from one memory cell to another memory cell by traversing the entire memory structure from the first cell to the processor register, and then traversing the memory structure again as the data is transferred from the processor register to the second memory cell. In the present system, the control logic for the memory system is capable of operating in a mode in which, rather than traversing the entire memory structure between each memory cell and the processor register, the data traverses this structure only until the data reaches the first component which is common to each half of the data path. Then, instead of traversing the portion of the memory structure between this component and the processor register twice, the data is transferred from the common component back through the portion of the data path that is between the common component and the second memory cell.

In this embodiment, the first component of the memory structure that is common to both halves of the data path is the second sense amplifier. Thus, when data is transferred between memory cells, the data is read from a source memory cell by the corresponding "first" sense amplifier, and the output of the first sense amplifier is read by the second sense amplifier. Then, the output of the second sense amplifier is read by the "first" sense amplifier of the destination memory cell, from which the data is written to the destination memory cell itself. This data transfer operation may be performed simultaneously for entire bytes or words of data, and some of the bits may be masked during such multi-bit operations. The system may also be operated conventionally to read or write data in the memory cells.

Figure 1:
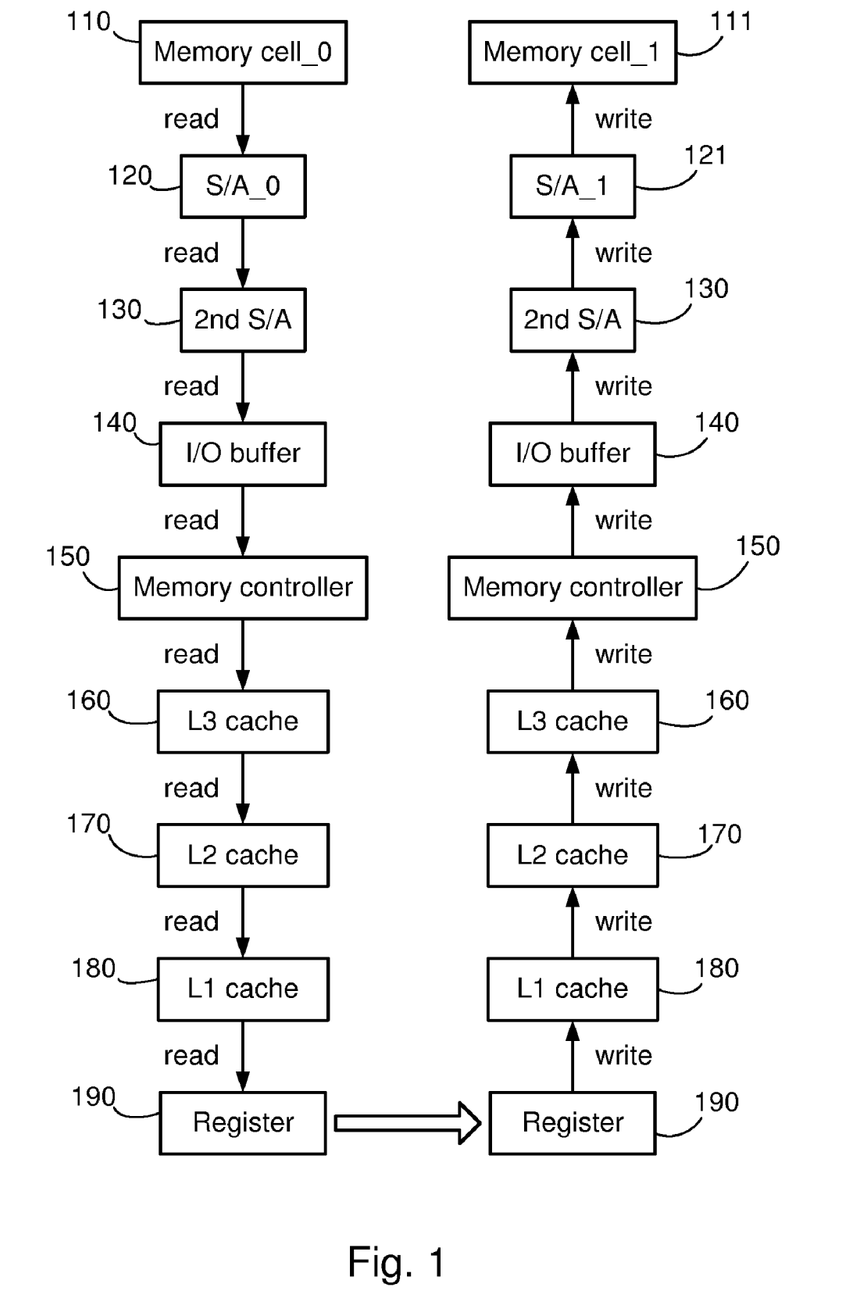
FIG. 1 is a block diagram illustrating the path typically traversed by data which is being transferred from a first (source) memory cell to a second (destination) memory cell in conventional memory systems.

Referring to FIG. 1, a block diagram illustrating the path typically traversed by data which is being transferred from a first (source) memory cell to a second (destination) memory cell in conventional memory systems. It should be noted that the figure may be viewed either as a flow diagram showing the steps in this process, or as a functional block diagram showing the components of the memory system which are involved in the process. In this example, data is being transferred from source memory cell_0 (110) to destination memory cell_1 (111.) Conventionally, this data transfer will be accomplished by having a processor access source memory cell 110 to read the data into one of the registers in the processor, and then having the processor access destination memory cell 111 to write the data into this memory cell.

While reading the data into a processor register and writing the data back into a different memory cell is conceptually very simple, it involves many different components in the hierarchy of the memory structure. As depicted in FIG. 1, the data is read from a source memory cell ("cell_0," 110) into a first-level sense amplifier, ("S/A_0," 120) which is coupled to source memory cell 110. The data is then read from first-level sense amplifier 120 by second-level sense amplifier 130, which amplifies the data to facilitate the reading of the data into an I/O buffer 140. Memory controller 150 then reads the data from I/O buffer 140. The data is then read into L3 cache 160, from which it is read into L2 cache 170, and then into L1 cache 180. The processor then reads the data into register 190. This completes the first half of the process—the reading of the data from the source memory cell into the processor register.

When the data is stored in register 190, he can begin the second half of the process—the writing of the data from the processor register into the destination memory cell. This part of the process is essentially the reverse of the first half of the process, except that the data is finally read into a different first-level sense amplifier and memory cell. It should be noted that the arrow in the figure between register 190 and register 190 indicates a transition from the first half of the process to the second half of the process, and is not intended to indicate that there are two different registers. In fact, memory system components (and processor register) 130-190 are common to both halves of the process. These components are depicted twice to more clearly show the path traversed by the data during the transfer from one memory cell to the other.

Thus, in the second half of the data transfer, the data in register 190 is written to L1 cache 180, then to L2 cache 170 and to L3 cache 160. From L3 cache 160, the data is written into memory controller 150, which then writes the data into I/O buffer 140. I/O buffer 140 then writes the data into second-level sense amplifier 130. As noted above, up to this point, the second half of the data transfer process has simply retraced the corresponding steps of the first half of the process. The second half of the process diverges from the first half when second-level sense amplifier 130 writes the data to first-level sense amplifier 121. First-level sense amplifier 121 then writes the data into destination memory cell 111, completing the data transfer.

Figure 2:
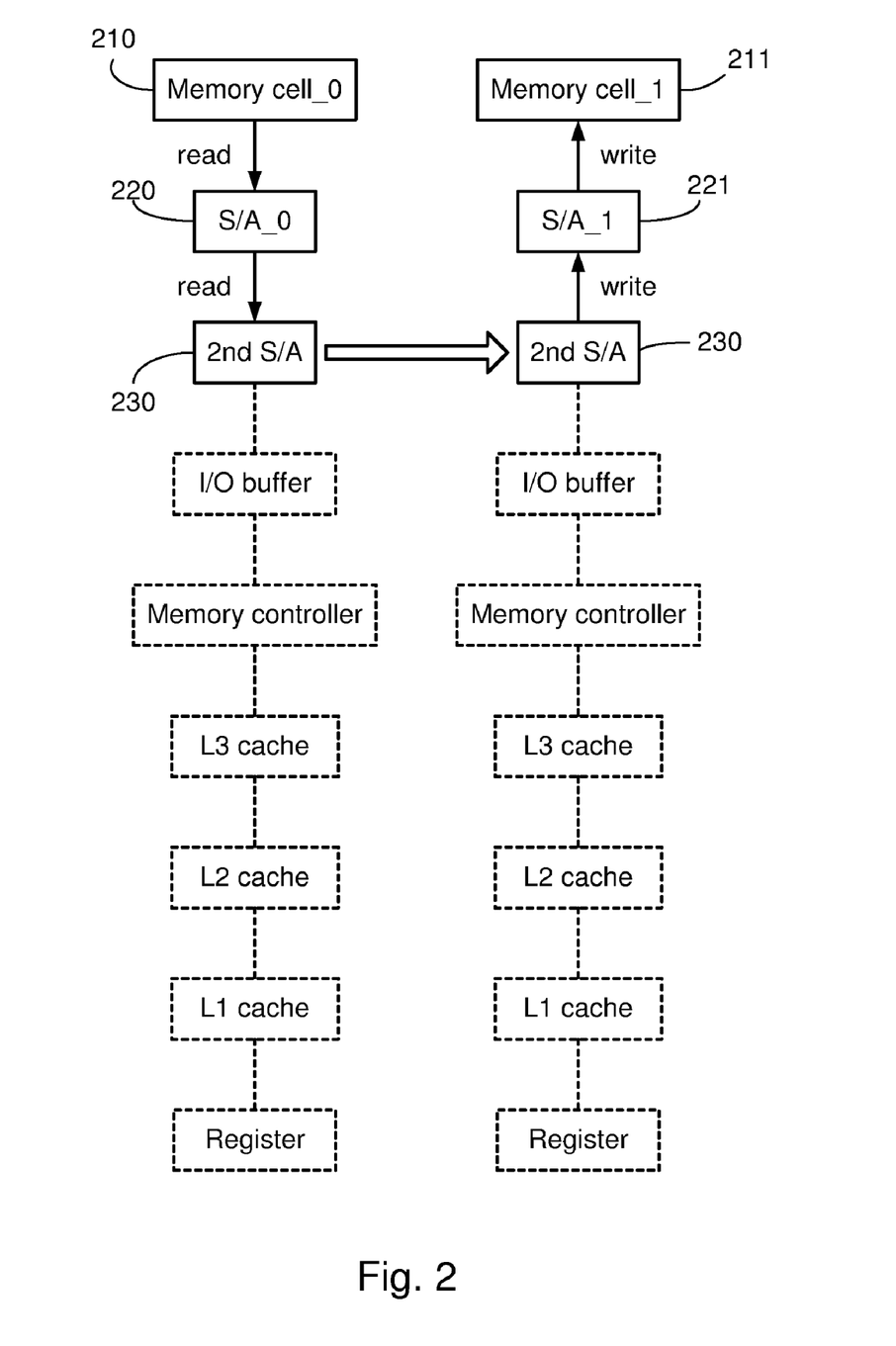
FIG. 2 is a block diagram illustrating the path traversed by data which is being transferred from a first memory cell to a second memory cell in accordance with one embodiment of the invention.

Referring to FIG. 2, a block diagram illustrating the path traversed by data which is being transferred from a first memory cell to a second memory cell in accordance with one embodiment of the invention is shown. In this embodiment, the data transfer process described in connection with FIG. 1 is effectively "short-circuited" at the second-level sense amplifier. Thus, the data in source memory cell 210 is read by the corresponding first-level sense amplifier 220, which is then read by the second-level sense amplifier 230. Second-level sense amplifier 230 then writes the data into first-level sense amplifier 221, which writes the data into the destination memory cell 211. Similar to FIG. 1, the arrow in FIG. 2 between second-level sense amplifier 230 and second-level sense amplifier 230 indicates a transition from the first half of the process to the second half of the process, and is not intended to indicate that there are two different second-level sense amplifiers It should be noted that FIG. 2 depicts the same memory system components that are shown in FIG. 1. These components are included in the figure for two reasons. The first reason is to point out the difference between the shortened data path of the data transfer in the present system and the longer data path of the data transfer in a conventional system. The second reason is to point out that the shortened data transfer path which is utilized in the present system makes use of identical physical memory system structures. Although the control logic which generates the control signals that operate the memory system components is configured to produce modified control signals which enable the shortened data transfer path, these control signals are provided to the same memory components/structures that are used in conventional systems. This facilitates implementation of the present system and also and reduces the cost of the system.

Figure 3:
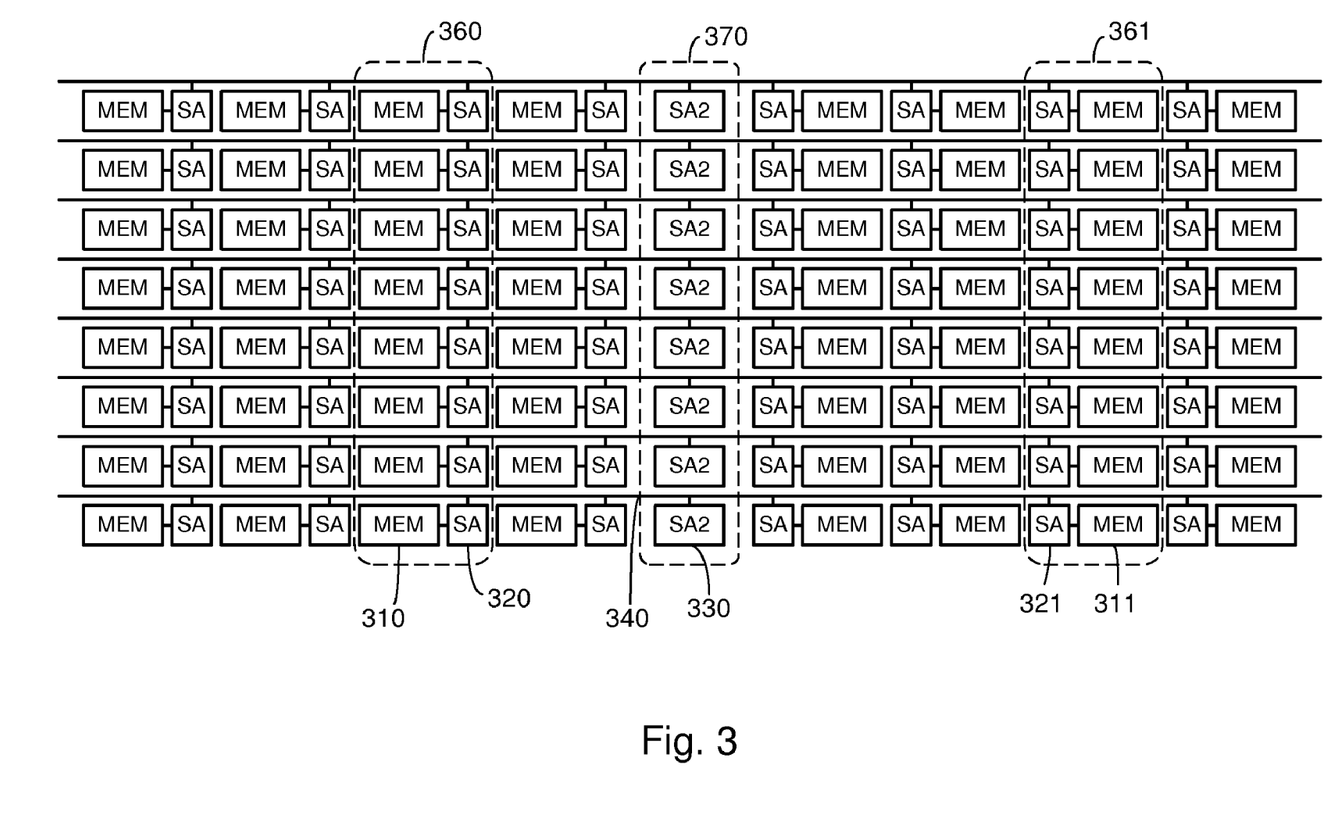
FIG. 3 is a diagram illustrating the structure of an array of memory cells in accordance with one embodiment.

Referring to FIG. 3, a diagram illustrating the structure of an array of memory cells in accordance with one embodiment is shown. The structure of the array is typical of a DRAM memory. The array consists of a set of memory cells (e.g., 310,) each of which is configured to hold one bit of data. Each of the memory cells is coupled to a corresponding first-level sense amplifier. For instance, memory cell 310 is coupled to sense amplifier 320. Each of the first-level sense amplifiers is coupled to a data line (e.g., 340.) Each data line has multiple of first-level sense amplifiers coupled to it. For example, there are eight first-level sense amplifiers that are depicted in FIG. 3 as being coupled data line 340, but there may be many additional first-level sense amplifiers coupled to the data line. Each data line has a single second-level sense amplifier (e.g., 330) coupled to it.

When the memory array of FIG. 3 is operated conventionally, data is read from the array by selecting desired ones of the memory cells so that the corresponding first-level sense amplifiers can read the data stored in the cells and put the data on the corresponding data lines. The data on the data lines can then be read by second-level amplifiers coupled to the data lines and be passed through the remainder of the hierarchy of memory system components as described in FIG. 1. Typically, the memory array is designed to read entire bytes or words of data from the array at the same time. For instance, the portion of the array depicted in FIG. 3 includes eight rows of memory cells. When data is read from the array, an entire column of memory cells (e.g., 360) is read at once. The data bits from these memory cells is provided to the corresponding second-level sense amplifiers (e.g., 370,) providing a byte of data that will be passed through the chain of memory components.

When it is desired to transfer data from one location in the array of memory cells to another, the set of cells at the source location (e.g., 360) are selected and are read through the first-level sense amplifiers into the second-level sense amplifiers (e.g. 370) in a conventional manner. Rather than passing the data from the second-level sense amplifiers to an I/O buffer, however, the data is written directly from the second-level sense amplifiers (e.g., 370) to the set of destination memory cells (e.g., 361) via the corresponding first-level sense amplifiers. In one embodiment, the data is read from the source memory cells and written into the destination memory cells in the same amount of time it conventionally takes to simply read the data from the source cells into the second-level sense amplifiers.

Figure 4:
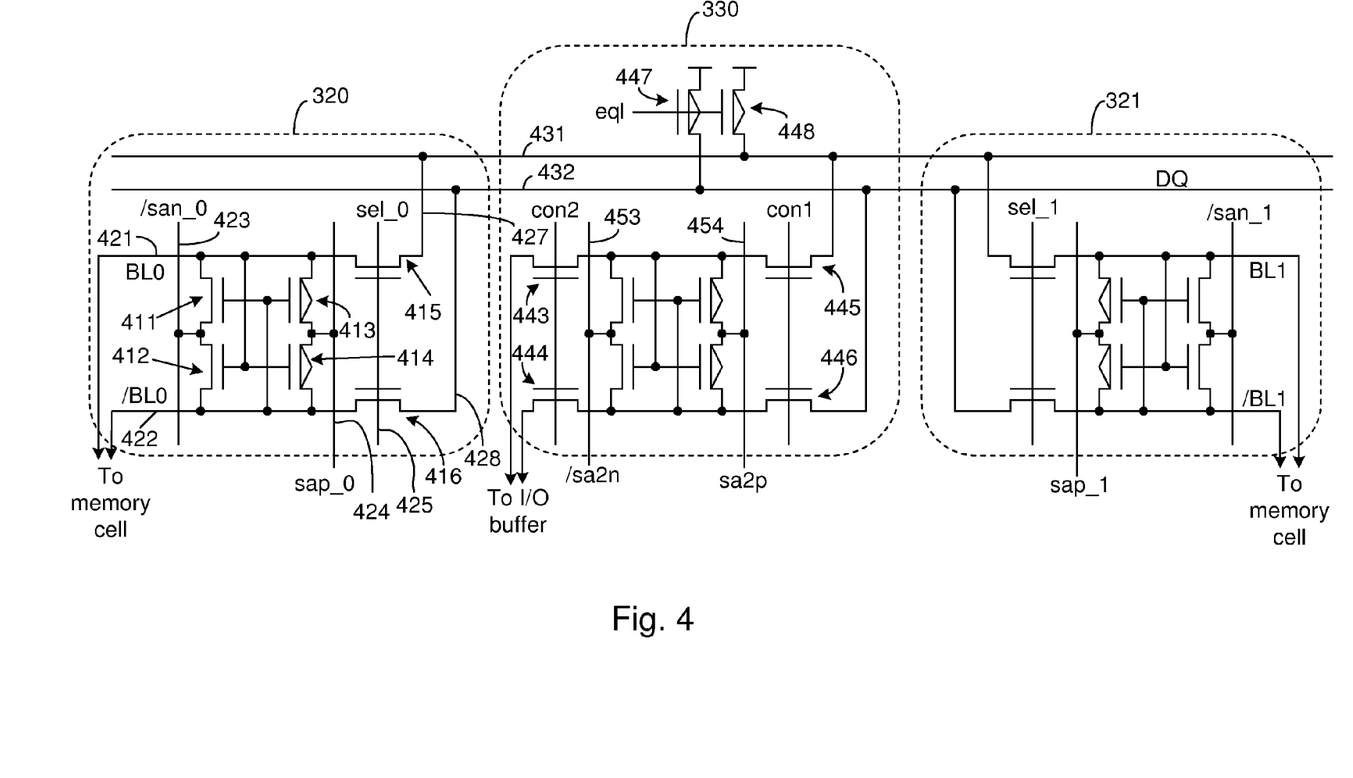
FIG. 4 is a diagram illustrating the structure and interconnection of first-level and second-level sense amplifiers in accordance with one embodiment.

Referring to FIG. 4, a diagram illustrating the structure and interconnection of first-level and second-level sense amplifiers in accordance with one embodiment is shown. FIG. 4 includes first-level sense amplifier 320 for source memory cell 310, second-level sense amplifier 330, and first-level sense amplifier 321 for destination memory cell 311. It should be noted that the structure of any of the first-level sense amplifiers will be the same.

First-level sense amplifier 320 has a structure which is typical in conventional DRAM memory arrays. Sense amplifier 320 consists of six transistors (411-416) arranged as depicted in the figure. Transistors 413 and 414 are p-channel transistors, while transistors 411, 412, 415 and 416 are n-channel transistors. Lines 421 and 422 are connected to the bit lines of the corresponding memory cell. Line 421 carries the data bit stored in the memory cell, while line 422 carries the complement (inverse) of the data bit. Line 424 is configured to receive a p-channel enable signal, while line 423 is configured to receive the complement of an n-channel enable signal. Line 425 carries a select signal. Lines 427 and 428 couple bit lines 421 and 422 of the sense amplifier to data lines 431 and 432, respectively. It should be noted that, while a single data line (e.g., 340) was depicted in FIG. 3 for purposes of clarity, there are actually two separate data lines—one which carries the value of the data bit, and one which carries the complement of this value (the inverse of the data bit.)

First-level sense amplifier 321 has a structure which is identical to the structure of sense amplifier 320. The components of sense amplifier 321 are, however, reversed (left-to-right) in the figure with respect to the components of sense amplifier 320. The control and data signals for sense amplifier 321 are, of course, different from those of sense amplifier 320. The signals implemented in sense amplifier 321 include data bit value BL1 and its complement /BL1, transistor enable signals sap_1 and san_1, and select signal sel_1. Sense amplifier 321 is coupled to the same data lines (431, 432) to which sense amplifier 320 is coupled.

Second-level sense amplifier 330 has a structure which is very similar to the structure of first-level sense amplifiers 320 and 321. Where each of the first-level sense amplifiers is coupled between a memory cell and the data lines (431, 432,) however, second-level sense amplifier 330 is coupled between the data lines and an I/O buffer (see the structure illustrated in FIG. 1.) Sense amplifier 330 is enabled by signals sa2p and /sa2n on lines 453 and 454, respectively. Sense amplifier 330 is selectively coupled to data lines 431 and 432 by transistors 445 and 446, which are controlled by a first connect signal, con1. Sense amplifier 330 is selectively coupled to the I/O buffer three transistors 443 and 444, which are controlled by a second connect signal, con2.

In FIG. 4, second-level sense amplifier 330 includes a pair of equalization transistors 447 and 448. These transistors need not be considered part of sense amplifier 330, but they are included in the description of the sense amplifier for the sake of convenience. Transistors 447 and 448 are used to equalize data lines 431 and 432 by precharging them to Vdd. Equalization transistors 447 and 448 are both controlled by equalization signal eql.

Figure 5:
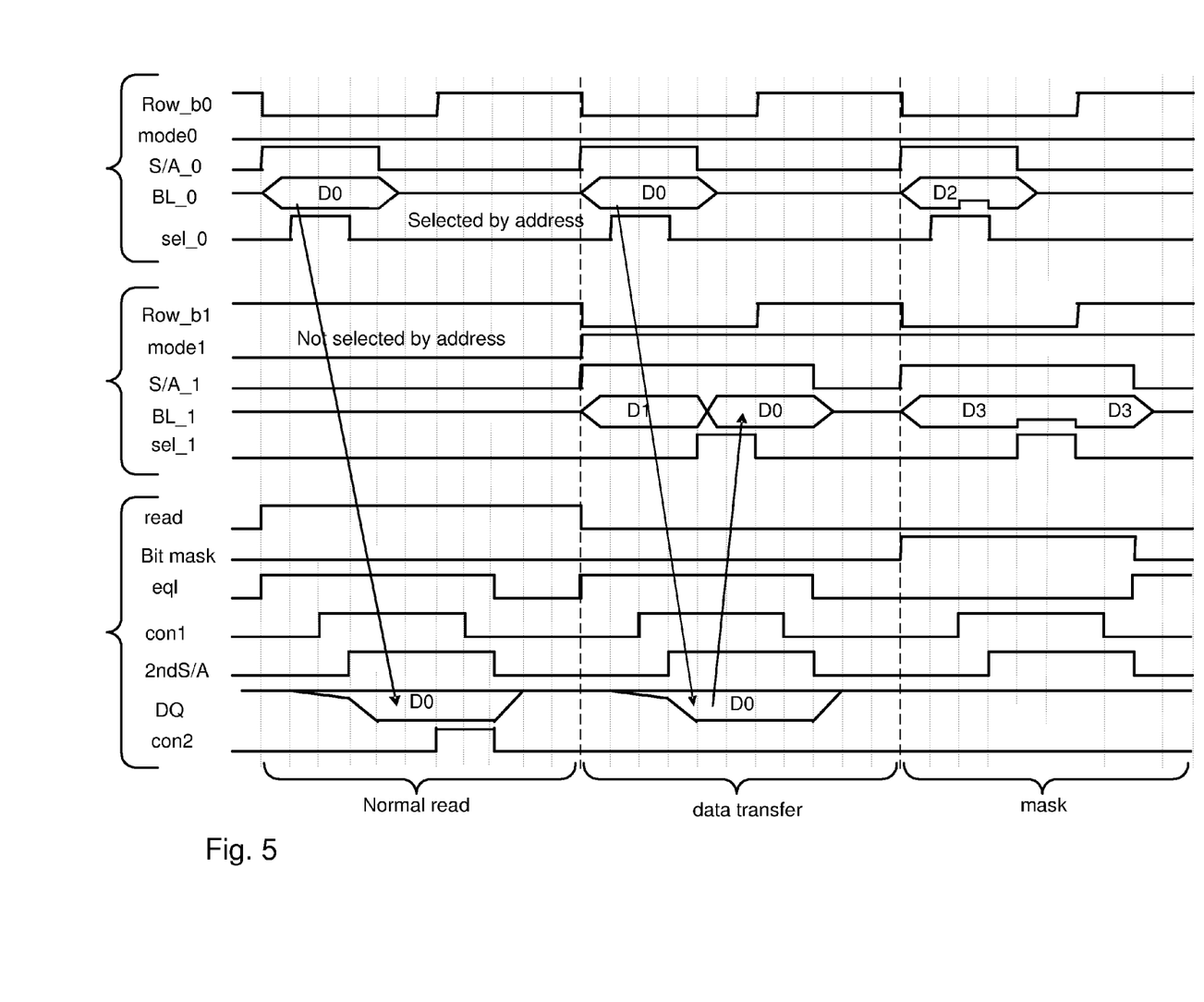
FIG. 5 is a timing diagram illustrating several modes of operation of the memory structure of FIGS. 3 and 4.

Referring to FIG. 5, a timing diagram illustrating several modes of operation of the memory structure of FIGS. 3 and 4 is shown. FIG. 5 shows the signals corresponding to each of the three sense amplifiers described above. The signals for first-level sense amplifier 320 are grouped at the top of the figure, the signals for first-level sense amplifier 321 are grouped in the middle of the figure, and to the signals for second-level sense amplifier 330 are grouped at the bottom of the figure. It should also be noted that the timing diagram can be divided into three different time segments corresponding to the three different modes of operation. At the left side of the figure, a normal (conventional) read operation is illustrated. In the middle of the figure, a data transfer from one first-level sense amplifier to another is illustrated. Finally, at the right side of the figure, a mask operation is illustrated.

Referring to the left side of FIG. 5, the signals for each of the three sense amplifiers are shown during a conventional read operation. In this operation, data is read from a first (source) first-level sense amplifier into the second-level sense amplifier. The second first-level sense amplifier is not involved in this operation, so the signals for this sense amplifier (shown in the center of the figure) are idle during the operation.

Referring to the signals associated with the second-level sense amplifier, it can be seen that, prior to initiation of the read operation, signal eql is low. As a result, the equalization transistors (447 and 448) coupled to data lines 431 and 432 are switched on, causing the data lines to the pre-charged to Vdd. When the read signal is asserted at the beginning of the read operation, signal eql goes high, switching off the equalization transistors and isolating the data lines from the precharge voltage.

At the beginning of the read operation, sense amplifier 320 is activated for the read operation when signal Row_b0 (at the top of the figure) goes low. Signal mode0 is low, and will remain low for the duration of the operation. When signal S/A_0 goes high, sense amplifier 320 is enabled. (Although not shown in FIG. 5, transistor enable signals sap_0 and san_0 are generated from S/A_0 and, in this case, are the same as this signal.) When sense amplifier 320 is enabled, bit line signal BL0 is pulled to the data value stored in the corresponding memory cell, and its complement, /BL0 on the other bit line is pulled to the opposite value. When select signal sel_0 is asserted, transistors 415 and 416 are switched on, coupling the bit lines of the sense amplifier to the common data lines (431, 432) and putting the data values on these lines. It can be seen that, when select signal sel_0 is asserted, the value (DQ) on one of the data lines begins to be pulled down, while the other remains high.

After the bit lines of first-level sense amplifier 320 have been coupled to data lines 431 and 432, signal con1 is asserted to connect second-level sense amplifier 330 to the data lines. Then, second-level sense amplifier 330 is enabled by asserting signal 2ndS/A. (It should be noted that transistor enable signals sa2p and sa2n in this embodiment of the same as 2ndS/A.) When second-level sense amplifier 330 is enabled, it can be seen that the values on the data lines are more rapidly pulled to the appropriate values (one being pulled low and the other remaining high.) When second-level sense amplifier 330 is enabled by signal 2ndS/A going high, signal sel_0 goes low, and decoupling first-level sense amplifier 320 from the data lines. After sense amplifier 320 is decoupled from the data lines, signal S/A_0 goes low, disabling this first-level sense amplifier. The sense amplifier is then deselected when signal Row_b0 goes high.

When the values on data lines 431 and 432 have been pulled to the appropriate values, connect signal con2 is asserted in order to connect second-level sense amplifier 330 to the I/O buffer. The data values are thereby passed to the I/O buffer, from which they can be passed up the memory system hierarchy. After sense amplifier 330 has been coupled to the I/O buffer, first connect signal con1 goes low, disconnecting the sense amplifier from data lines 431 and 432. Then, enable signal 2ndS/A and second connect signal con2 are deasserted, decoupling the second-level sense amplifier from the I/O buffer and disabling the sense amplifier. At the same time, equalization signal eql goes low, switching on the equalization transistors and precharging data lines 431 and 432 for the next operation.

Referring to the center portion of FIG. 5, a data transfer operation from one first-level sense amplifier to another is shown. As noted above, the data is transferred in this operation from a source first-level sense amplifier to a second-level sense amplifier and then back to a destination first-level sense amplifier without having to transfer the data to a processor or memory controller. The data transfer operation is completed in the same amount of time required for the read operation described above and illustrated on the left side of FIG. 5.

The operation of first-level sense amplifier 320 (the source sense amplifier) is the same in this operation as it was in the conventional read operation. The sense amplifier is selected by the Row_b0 signal going low and enabled by the S/A_0 signal going high. The data signals BL_0 and /BL_0 are then pulled high and low according to the data bit stored in the corresponding memory cell, and the sense amplifier is coupled to data lines 431 and 432 by select signal sel_0 going high.

The operation of second-level sense amplifier 330 is very similar to the operation of this component during a conventional read operation. At the beginning of the data transfer operation, equalization signal eql goes high, shutting off the equalization transistors. Connect signal con1 then goes high, coupling sense amplifier 330 two data lines 431 and 432. Enable signal 2ndS/A then goes high, pulling the values on data lines 431 and 432 to the appropriate high and low values. The behavior of second-level sense amplifier 330 during the data transfer operation is different from its behavior during the conventional read operation in that the read signal is low instead of high and, as a result, connect signal con2 is not asserted during the data transfer operation. Since connect signal con2 is never asserted during this operation, the data in sense amplifier 330 is never transferred to any higher-level components (e.g., an I/O buffer) in the memory system.

At the beginning of the data transfer operation, first-level sense amplifier 321 is selected to receive the transferred data by the assertion of the Row_b1 signal (which is low when asserted.) Mode signal mode1 is high during the entire data transfer operation. When the operation begins, sense amplifier 321 is enabled by assertion of enable signal S/A_1. When the sense amplifier is enabled, the values on the sense amplifier's bit lines are pulled high or low according to the data bit stored in the corresponding memory cell. This is indicated by data signal BL1 taking on the value the value D1 after the sense amplifier is enabled. After the data bit has been transferred from the source sense amplifier (320) to the second-level sense amplifier (330,) destination sense amplifier 321 is coupled to data lines 431 and 432 by asserting select signal sel_1. At this point, source sense amplifier 320 has already been decoupled from data lines 431 and 432. When destination sense amplifier 321 is coupled to the data lines, the transferred data value is being maintained on the data lines by second-level sense amplifier 330. Accordingly, this data value is read into destination sense amplifier 321. Destination sense amplifier 321 is then decoupled from data lines 431 and 432 by deasserting select signal sel_1. Second-level sense amplifier 330 is then decoupled from the data lines by deasserting connect signal con1, and the sense amplifier is subsequently disabled by deasserting enable signal 2ndS/A. At approximately the same time, equalization signal eql goes low, precharging the data lines to Vdd. The data transfer operation is then complete.

Referring to the right-hand portion of FIG. 5, a mask feature in a data transfer operation from one first-level sense amplifier to another is shown. Data transfer operations may be carried out simultaneously with respect to sets of data bits (e.g., bytes or words of data) in the same way data is normally read in bytes or words. In such a case, the data transfer operation described above and illustrated in the center portion of FIG. 5 is carried out for each of the involved memory cells and corresponding sense amplifiers. It may, however, be desirable in some instances to mask some of the bits so that they are not affected by the data transfer operation. The masking of these bits during a data transfer operation is illustrated in the right-hand portion of FIG. 5.

For bits which are to be masked during a data transfer operation, the bit mask signal is asserted (high) during the operation. When the bit mask signal is asserted, equalization signal eql also remains asserted, so the equalization transistors for the second-level sense amplifier (e.g., 447, 448) remains switched on, and the corresponding data lines (e.g., 431, 432) continue to be pre-charged to Vdd during the data transfer operation. It can be seen in FIG. 5 that the values (DQ) on both data lines remain high for the masked bit. Because the values on both data lines remain high, the data which is initially stored in the memory cell of the destination first-level sense amplifier (in this case, D3) is not changed by the data transfer operation, regardless of the value stored in the memory cell of the source first-level sense amplifier (in this case, D2.) In this embodiment, the first-level sense amplifiers are enabled and coupled to the data lines as they would be during the data transfer operation described above. As a result, the precharged data lines cause the bit line in each first-level sense amplifier which has a 0 value (either BL_i or /BL_i) to be pulled up. This is shown in the figure by the small increase in the data value on each first-level sense amplifier's bit line when the sense amplifier is coupled to the data lines (i.e., when sel_i is high.) While the effect is not enough to flip (change) the value stored in the sense amplifier, it produces a small amount of noise, as shown in the figure.

As pointed out above, the structure of the memory system, including the memory cells, first-level sense amplifiers in second-level sense amplifiers is conventional. The new functionality of the present system is provided by generating control signals for these memory system components that cause them to operate as described above in the data transfer and mask modes of operations. These signals are generated by control logic which will be described in more detail below in connection with FIGS. 6-10. It should be noted that many of the signals are generated using delay elements. The length of the delay will be indicated by the number of intervals by which the element delays a signal. Each of these intervals corresponds to the interval between successive dotted lines in FIG. 5. As shown in this figure, there are 11 intervals in each operation period.

Figure 6:
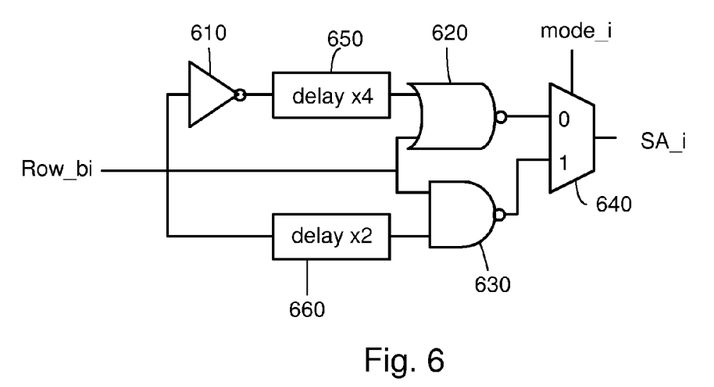
FIG. 6 is a logic circuit configured to generate sense amplifier enable signals in accordance with one embodiment.

Referring to FIG. 6, a logic circuit configured to generate enable signals S/A_0 and S/A_1 in accordance with one embodiment is shown. Row select signal Row_bi and mode signal mode_i are the inputs to the circuit. (As used in the following discussion, "i" denotes the number of the first-level sense amplifier for which the signal is provided.) When the mode of the sense amplifier (mode_i) is 0, multiplexer 640 provides the output of NOR gate 620 as signal S/A_i. The two inputs to NOR gate 620 are Row_bi and the inverse of Row_bi, delayed by four intervals. Row_bi is high when not asserted. S/A_i is therefore normally low. When Row_bi goes low, S/A_i goes high and remains high for four intervals, then goes low again. When the mode of the sense amplifier is 1, multiplexer 640 provides the output of NAND gate 630 as S/A_i. The inputs to NAND gate 630 are Row_bi and Row_bi, delayed by two intervals. Because Row_bi is high when not asserted, S/A_i is normally low when the mode is 1. When Row_bi goes low in mode_i=0, S/A_i immediately goes high, and remains high until two intervals after Row_bi goes high.

Figure 7:
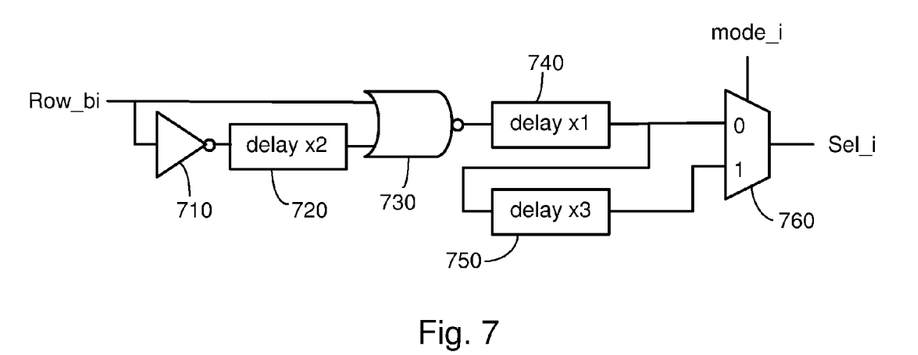
FIG. 7 is a logic circuit configured to generate sense amplifier select signals in accordance with one embodiment.

Referring to FIG. 7, a logic circuit configured to generate select signals sel_i in accordance with one embodiment is shown. Again, Row select signal Row_bi and mode signal mode_i are the inputs to the circuit. In this circuit, the first three components (710-730) create a two-interval-wide pulse, while the last three (740-760) delay the pulse by either one or four pulses. NOR gate 730 receives as inputs Row_bi and the inverse of this signal, delayed by two intervals. The output of NOR gate 730 is therefore low until Row_bi goes low. At this point, the output of NOR gate 730 goes high, remains high for two intervals, and then goes low again. This pulse is then passed through a one-interval delay element 740 and provided to a first input of multiplexer 760. The delayed pulse is also passed through a second delay element before being provided to a second input of multiplexer 760. The mode_i signal is provided as a control input to multiplexer 760 to control whether the one-interval-delayed pulse or the four-interval-delayed pulse is selected to be output from the multiplexer as select signal sel_i.

Figure 8:
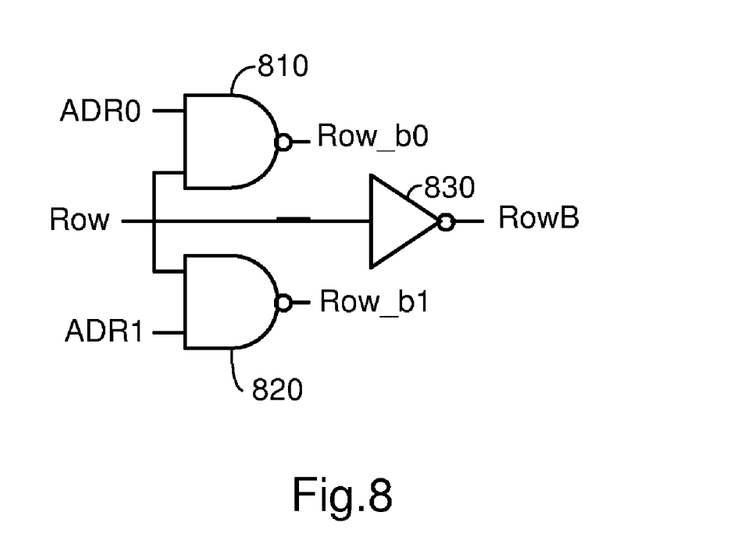
FIG. 8 is a logic circuit configured to generate row select signals used in the sense amplifiers in accordance with one embodiment.
Figure 9:
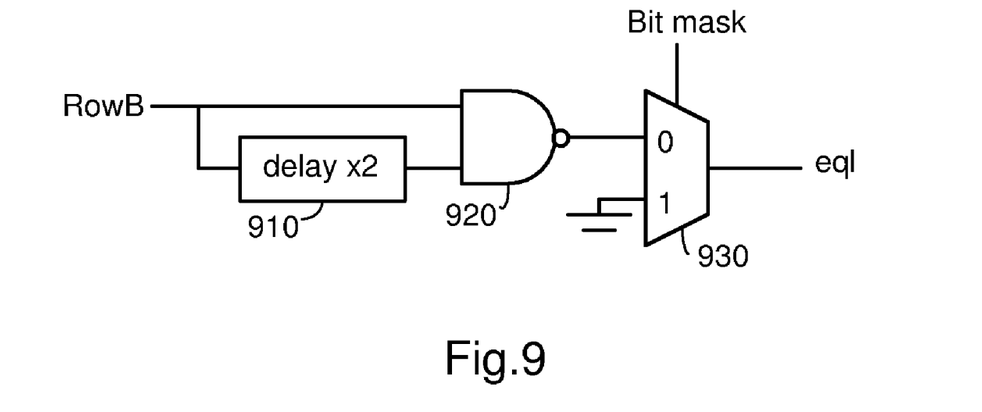
FIG. 9 is a logic circuit configured to generate a data line equalization signal in accordance with one embodiment.
Figure 10:
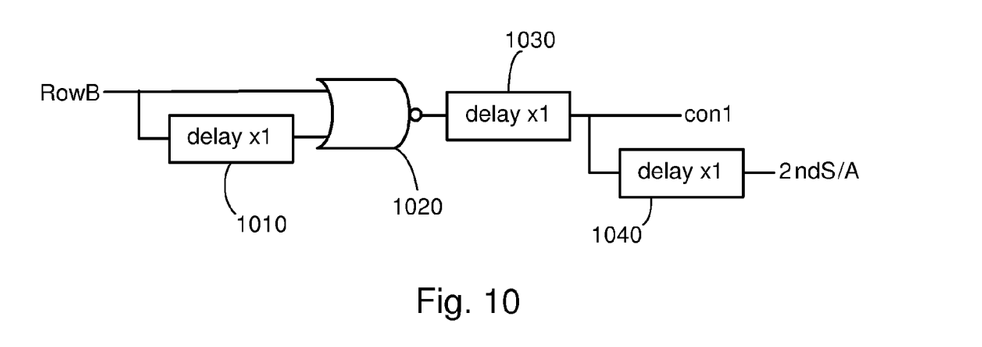
FIG. 10 is a logic circuit configured to generate a first connect signal and an enable signal for a second-level sense amplifier in accordance with one embodiment.
Figure 11:
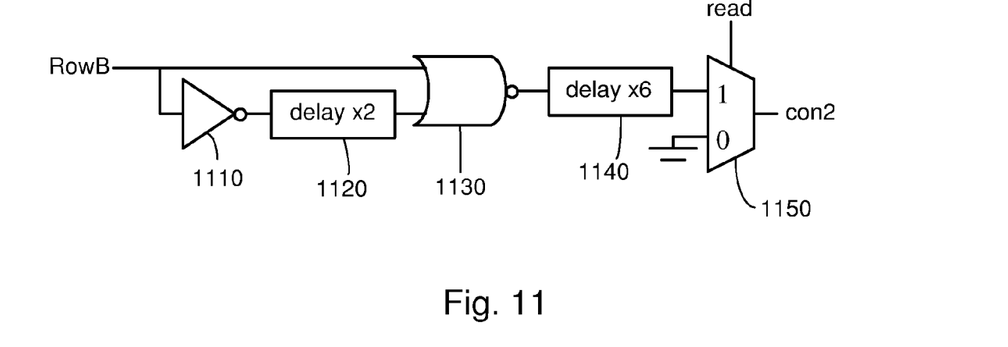
FIG. 11 is a logic circuit configured to generate a second connect signal for a second-level sense amplifier in accordance with one embodiment.

Referring to FIG. 8, a logic circuit configured to generate signals Row_bi and RowB, which is used in the circuits of FIGS. 9-11. The circuit consists of two NAND gates (810, 820) and an inverter 830. The inputs to NAND gate 810 are a row signal (Row) and an address signal (ADR0.) The output of NAND gate 810 is Row_b0. NAND gate 820 is similarly configured, receiving the row signal (Row) and address signal ADR1 as inputs, and generating Row_b1 as an output. The row signal (Row) is also input to inverter 830 to produce signal RowB.

Referring to FIG. 9, a logic circuit configured to generate the equalization signal eql is shown. This circuit consists of a delay element 910, a NAND gate 920 and a multiplexer 930. The Bit mask signal is used as a control input to multiplexer 930. When the Bit mask signal is 1, multiplexer 930 selects the input that is tied to ground, so the equalization signal is 0. When the Bit mask signal is 0, multiplexer 930 selects the output of NAND gate 920. When signal RowB is low, the output of NAND gate 920 is high. When signal RowB goes high, the output of NAND gate 920 goes low two intervals later, and stays low as long as RowB remains high.

Referring to FIG. 10, a logic circuit configured to generate the first connect signal (con1) and the enable signal (2ndS/A) for the second-level sense amplifier is shown. This circuit consists of a NOR gate 1020 and three delay elements 1010, 1030 and 1040. The RowB signal is input to delay element 1010, and the output of this delay element is input to NOR gate 1020, along with the original RowB signal. When RowB is low for two intervals, both of the inputs to NOR gate 1020 are low, so the output of the NOR gate is high. When RowB goes high, the output of NOR gate 1020 goes low. When RowB goes low again, the output of NOR gate 1020 goes low one interval later (because of delay element 1010.) Since connect signal con1 is the output of NOR gate 1020, delayed by one interval, con1 goes low one interval after RowB goes high, and con1 goes high two intervals after RowB goes low. Second-level sense amplifier enable signal 2ndS/A is the same as connect signal con1, except that it is delayed by one additional interval because of delay element 1040.

Referring to FIG. 11, a logic circuit configured to generate the second connect signal (con2) for the second-level sense amplifier is shown. This circuit consists of an inverter 1110, two delay elements 1120 and 1140, a NOR gate 1130, and multiplexer 1150. The read signal is used as a control input to multiplexer 1150. When the read signal is 1, multiplexer 1150 selects the input that is tied to ground, so connect signal con2 is 0. When the read signal is 0, multiplexer 1150 selects the output of delay element 1140. Signal RowB is provided to one input of NOR gate 1130. RowB is also inverted and delayed by 1 interval before being provided to the other input of NOR gate 1130. As a result, the output of NOR gate 1130 goes high when RowB goes low, and remains high for two intervals before going low again. Since delay element 1140 delays this signal by six intervals, when the read signal is high, connect signal con2 goes high six intervals after RowB goes low, and then goes low again two intervals later.

It should be noted that the embodiments described above are exemplary of the various possible implementations of the invention. Alternative embodiments may differ from these exemplary embodiments in many ways. For example, the control signals described above in connection with FIG. 5 may be generated by logic circuits other than those illustrated in FIGS. 6-11. It may also be possible in other embodiments to transfer data directly form one first-level sense amplifier to another without having to involve the second-level sense amplifier, or by using an alternative component to facilitate the transfer. Such variations will be apparent to those of skill in the art upon reading the present disclosure, and are contemplated to be within the scope of the invention as claimed below.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A memory system comprising:
   a pair of first-level sense amplifiers, each configured to be selectively coupled to a data line which is coupled to a memory cell array;
   a second-level sense amplifier configured to be selectively coupled to the data line; and
   a processor coupled to the first-level sense amplifiers and the second-level sense amplifier and configured to
      control a source one of the first-level sense amplifiers to place data from a corresponding memory cell on the data line,
      control the second-level sense amplifier to maintain the data on the data line, and
      control a destination one of the first-level sense amplifiers to read the data on the data line into a corresponding memory cell.

2. The memory system of claim 1, wherein the processor is configured to isolate the second-level sense amplifier from higher-level memory components.

3. The memory system of claim 1, wherein the processor is configured to:
   couple the source first-level sense amplifier to the data line;
   couple the second-level sense amplifier to the data line while the source first-level sense amplifier is coupled to the data line;

decouple the source first-level sense amplifier from the data line; and couple the destination first-level sense amplifier to the data line while the second-level sense amplifier is coupled to the data line.

4. The memory system of claim 1, wherein the processor is configured to:

control a plurality of source first-level sense amplifiers to place data from corresponding memory cells on corresponding data lines;

control a plurality of second-level sense amplifiers, each corresponding to one of the data lines, to maintain the data on the corresponding data lines; and control a plurality of destination first-level sense amplifiers to read the data on corresponding ones of the data lines into a corresponding memory cells.

5. The memory system of claim 4, wherein the processor is configured to mask the data on one or more of the data lines.

6. The memory system of claim 5, wherein the processor is configured to mask the data by precharging the one or more data lines while the corresponding destination first-level sense amplifiers attempt to read the data on the one or more data lines.

7. The memory system of claim 1, wherein each of the first-level sense amplifiers is coupled to a corresponding DRAM memory cell.

8. The memory system of claim 1, wherein the physical structure of the first-level sense amplifiers, second-level sense amplifier and data line are conventional.

9. The memory system of claim 1, wherein the processor is configured to, in a conventional read mode:

control the source first-level sense amplifier to place data from the corresponding memory cell on the data line; and control the second-level sense amplifier to read the data from the data line and provide the data to a higher-level memory component.

10. The memory system of claim 9, wherein the higher-level memory component comprises an I/O buffer.

11. A method implemented in a memory system having a pair of first-level sense amplifiers and a second-level sense amplifier, each sense amplifier being configured to be selectively coupled to a data line which is coupled to a memory cell array, the method comprising:

controlling a source one of the first-level sense amplifiers to place data from a corresponding memory cell on the data line, controlling the second-level sense amplifier to maintain the data on the data line, and controlling a destination one of the first-level sense amplifiers to read the data on the data line into a corresponding memory cell.

12. The method of claim 11, further comprising isolating the second-level sense amplifier from higher-level memory components while the second-level sense amplifier maintains the data on the data line.

13. The method of claim 11, further comprising controlling the sense amplifiers by:

coupling the source first-level sense amplifier to the data line;

coupling the second-level sense amplifier to the data line while the source first-level sense amplifier is coupled to the data line;

decoupling the source first-level sense amplifier from the data line; and coupling the destination first-level sense amplifier to the data line while the second-level sense amplifier is coupled to the data line.

14. The method of claim 11, further comprising:

controlling a plurality of source first-level sense amplifiers to place data from corresponding memory cells on corresponding data lines;

controlling a plurality of second-level sense amplifiers, each corresponding to one of the data lines, to maintain the data on the corresponding data lines; and controlling a plurality of destination first-level sense amplifiers to read the data on corresponding ones of the data lines into a corresponding memory cells.

15. The method of claim 14, further comprising masking the data on one or more of the data lines.

16. The method of claim 15, wherein masking the data comprises precharging the one or more data lines while controlling the corresponding destination first-level sense amplifiers to read the data on the one or more data lines.

17. The method of claim 11, further comprising controlling the source first-level sense amplifier to read the data from a corresponding DRAM memory cell and controlling the destination first-level sense amplifier to read the data into a corresponding DRAM memory cell.

18. The method of claim 11, wherein the method is implemented in a memory system in which the first-level sense amplifiers, second-level sense amplifier and data line have a conventional physical structure.

19. The method of claim 11, further comprising, in a conventional read mode, controlling the source first-level sense amplifier to place data from the corresponding memory cell on the data line; and controlling the second-level sense amplifier to read the data from the data line and provide the data to a higher-level memory component.

20. The method of claim 11, wherein controlling the second-level sense amplifier to provide the data to a higher-level memory component comprises controlling the second-level sense amplifier to provide the data to an I/O buffer.

* * * * *